United States Patent
Li

(10) Patent No.: US 11,239,221 B2
(45) Date of Patent: Feb. 1, 2022

(54) ARRAY SUBSTRATE AND FABRICATION METHOD THEREOF, AND ELECTRONIC APPARATUS

(71) Applicant: BOE Technology Group Co., Ltd., Beijing (CN)

(72) Inventor: Haixu Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 1 day.

(21) Appl. No.: 16/631,016

(22) PCT Filed: Nov. 2, 2018

(86) PCT No.: PCT/CN2018/113792
§ 371 (c)(1),
(2) Date: Jan. 14, 2020

(87) PCT Pub. No.: WO2020/087525
PCT Pub. Date: May 7, 2020

(65) Prior Publication Data
US 2021/0066267 A1    Mar. 4, 2021

(51) Int. Cl.
*H01L 25/16* (2006.01)
*H01L 27/12* (2006.01)
*H01L 33/62* (2010.01)

(52) U.S. Cl.
CPC .......... *H01L 25/167* (2013.01); *H01L 27/124* (2013.01); *H01L 27/1248* (2013.01); *H01L 27/1288* (2013.01); *H01L 33/62* (2013.01); *H01L 2933/0066* (2013.01)

(58) Field of Classification Search
CPC . H01L 25/167; H01L 27/124; H01L 27/1248; H01L 27/1288; H01L 2933/0066; H01L 33/62
USPC .......................................................... 257/72
See application file for complete search history.

(56) References Cited

U.S. PATENT DOCUMENTS

| 6,870,197 | B2 | 3/2005 | Park et al. |
| 10,580,804 | B2 | 3/2020 | Li et al. |
| 2015/0102349 | A1 | 4/2015 | Lee et al. |
| 2017/0033166 | A1* | 2/2017 | Shim .................. H01L 27/3279 |

(Continued)

FOREIGN PATENT DOCUMENTS

| CN | 1479562 A | 3/2004 |
| CN | 104576653 A | 4/2015 |

(Continued)

*Primary Examiner* — Igwe U Anya
(74) *Attorney, Agent, or Firm* — Banner & Witcoff, Ltd.

(57) ABSTRACT

An array substrate and a fabrication method thereof, and an electronic apparatus are disclosed. The array substrate includes a base substrate, a thin film transistor, a first connection electrode and a first insulation layer. The thin film transistor is on the base substrate and including a first electrode and a second electrode; the first connection electrode in a layer different from the first electrode and electrically connected with the first electrode; and the first insulation layer covering at least a portion of the first connection electrode; an area of an orthographic projection of the first connection electrode on the base substrate is larger than an area of an orthographic projection of the first electrode on the base substrate, and the first insulation layer is made from an organic insulation material.

18 Claims, 9 Drawing Sheets

(56) References Cited

U.S. PATENT DOCUMENTS

| | | | |
|---|---|---|---|
| 2017/0084635 A1* | 3/2017 | Jung | ............... H01L 27/1285 |
| 2017/0219867 A1 | 8/2017 | Guo et al. | |
| 2017/0338212 A1* | 11/2017 | Kuo | ............... H01L 27/1225 |
| 2017/0358503 A1* | 12/2017 | Liu | ............... H01L 27/1248 |
| 2019/0393283 A1 | 12/2019 | Lu et al. | |
| 2020/0161587 A1 | 5/2020 | Choi et al. | |

FOREIGN PATENT DOCUMENTS

| | | |
|---|---|---|
| CN | 107275350 A | 10/2017 |
| CN | 108155214 A | 6/2018 |
| CN | 108598136 A | 9/2018 |

\* cited by examiner

ARRAY SUBSTRATE AND FABRICATION METHOD THEREOF, AND ELECTRONIC APPARATUS

This application is a U.S. National Phase Entry of International Application No. PCT/CN2018/113792 filed on Nov. 2, 2018. The present application claims priority to and the benefit of the above-identified application and the above-identified application is incorporated by reference herein in its entirety.

TECHNICAL FIELD

At least one embodiment of the present disclosure relates to an array substrate and a fabrication method thereof, and an electronic apparatus.

BACKGROUND

In a display substrate or a lighting substrate, in some cases, a light emitting device (for example, a Micro LED device) requires a relatively large current, that is, it is required to satisfy a demand for a larger current by the light emitting device. Meanwhile, in a case where the display substrate has a higher requirement for resolution, it is also necessary to ensure high-density arrangement of array elements in a driving circuit.

SUMMARY

At least one embodiment of the present disclosure provides an array substrate, the array substrate comprises a base substrate, a thin film transistor, a first connection electrode and a first insulation layer. The thin film transistor is on the base substrate and comprising a first electrode and a second electrode; the first connection electrode in a layer different from the first electrode and electrically connected with the first electrode; and the first insulation layer covering at least a portion of the first connection electrode; an area of an orthographic projection of the first connection electrode on the base substrate is larger than an area of an orthographic projection of the first electrode on the base substrate, and the first insulation layer is made from an organic insulation material.

For example, the array substrate provided by at least one embodiment of the present disclosure further comprises a light emitting device; the light emitting device is on the base substrate, and the first electrode is electrically connected with the light emitting device through the first connection electrode; the first connection electrode comprises a first portion parallel to the base substrate and a second portion having an included angle with the base substrate; the first electrode comprises a first portion parallel to the base substrate and a second portion having an included angle with the base substrate; a first signal is transmitted to the light emitting device through the first electrode and the first connection electrode; on a plane parallel to the base substrate, a width of the first portion of the first connection electrode in a direction perpendicular to a transmission direction of the first signal is larger than a width of the first portion of the first electrode in the direction perpendicular to the transmission direction of the first signal, so that the area of the orthogonal projection of the first connection electrode on the base substrate is larger than the area of an orthogonal projection of the first electrode on the base substrate.

For example, in the array substrate provided by at least one embodiment of the present disclosure, on a plane parallel to the base substrate, the width of the first portion of the first connection electrode in the direction perpendicular to the first signal transmission direction is larger than 10 µm.

For example, the array substrate provided by at least one embodiment of the present disclosure further comprises a second insulation layer; the second insulation layer is between the thin film transistor and the first connection electrode to space the thin film transistor apart from the first connection electrode; the second insulation layer comprises at least two via holes, and the first connection electrode is electrically connected with the first electrode of the thin film transistor through the at least two via holes.

For example, in the array substrate provided by at least one embodiment of the present disclosure further comprises a light emitting device and a second connection electrode; the light emitting device is on the base substrate, and the first electrode is connected with the light emitting device through the first connection electrode; the second connection electrode is in a same layer as the first connection electrode, the first insulation layer further covers at least a portion of the second connection electrode, and an area of an orthographic projection of the second connection electrode on the base substrate is larger than the area of the orthographic projection of the first electrode on the base substrate; the light emitting device comprises a first terminal, a light-emitting layer and a second terminal, the first connection electrode is electrically connected with the first terminal, and the second connection electrode is electrically connected with the second terminal.

For example, in the array substrate provided by at least one embodiment of the present disclosure, a second signal is transmitted from the second connection electrode to the light emitting device; on a plane parallel to the base substrate, a width of the second connection electrode in a direction perpendicular to a transmission direction of the second signal is larger than 10 µm.

For example, in the array substrate provided by at least one embodiment of the present disclosure, the first connection electrode is made from a metal material, and the second connection electrode is made from a metal material.

For example, the array substrate provided by at least one embodiment of the present disclosure further comprises a plurality of array units arranged in an array and a black matrix; the light emitting device is in respective one of the plurality of array units; the black matrix is between adjacent array units of the plurality of array units and is opaque.

For example, the array substrate provided by at least one embodiment of the present disclosure further comprises a first terminal lead and a second terminal lead; the first connection electrode is electrically connected with the first terminal through the first terminal lead, and the second connection electrode is electrically connected with the second terminal through the second terminal lead; a gap is between the black matrix and the first terminal lead, and a gap is between the black matrix and the second terminal lead.

For example, the array substrate provided by at least one embodiment of the present disclosure further comprises a protrusion and a light emitting device; the protrusion is on a side of the first insulation layer away from the base substrate; and the light emitting device on the protrusion, wherein the first electrode is electrically connected with the light emitting device through the first connection electrode.

For example, in the array substrate provided by at least one embodiment of the present disclosure, the protrusion and the first insulation layer are integrally formed.

For example, in the array substrate provided by at least one embodiment of the present disclosure, the light emitting device is a small-sized light emitting diode or a micro-sized light emitting diode (Micro LED).

At least one embodiment of the present disclosure further provides an electronic apparatus comprising any one of the array substrates provided by the embodiments of the present disclosure.

At least one embodiment of the present disclosure further provides a fabrication method of an array substrate, the method comprises: providing a base substrate; forming a thin film transistor on the base substrate, wherein the thin film transistor comprises a first electrode and a second electrode; forming a first connection electrode on the base substrate, wherein the first connection electrode is in a layer different from the first electrode and is electrically connected with the first electrode; and forming a first insulation layer covering at least a portion of the first connection electrode, in which an area of an orthographic projection of the first connection electrode on the base substrate is larger than an area of an orthographic projection of the first electrode on the base substrate, and the first insulation layer is made from an organic insulation material.

For example, the fabrication method of the array substrate provided by at least one embodiment of the present disclosure further comprises: forming a light emitting device on the base substrate, in which the light emitting device is provided on the base substrate, and the first electrode is electrically connected with the light emitting device through the first connection electrode; and forming a second connection electrode, in which the second connection electrode and the first connection electrode are formed by a same patterning process with a same mask, the first insulation layer further covers at least a portion of the second connection electrode, and an area of an orthographic projection of the second connection electrode on the base substrate is larger than the area of the orthographic projection of the first electrode on the base substrate; the light emitting device comprises a first terminal, a light-emitting layer and a second terminal; the first connection electrode is electrically connected with the first terminal; and the second connection electrode is electrically connected with the second terminal.

For example, the fabrication method of the array substrate provided by at least one embodiment of the present disclosure further comprises: forming a first insulation material layer by using an organic insulation material, in which the first insulation material layer covers both the first connection electrode and the second connection electrode, the first insulation material layer is formed by a coating method; and performing a patterning process on the first insulation material layer to form the first insulation layer.

For example, the fabrication method of the array substrate provided by at least one embodiment of the present disclosure further comprises: forming a protrusion on a side of the first insulation layer away from the base substrate; and forming a light emitting device on the protrusion, in which the first electrode is electrically connected with the light emitting device through the first connection electrode.

For example, in the fabrication method of the array substrate provided by at least one embodiment of the present disclosure, the first insulation layer and the protrusion are formed by a same patterning process with a same dual-tone mask.

For example, in the fabrication method of the array substrate provided by at least one embodiment of the present disclosure, the first insulation layer is formed by a single patterning process with a first mask; and the protrusion is formed by a single patterning process with a second mask.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

REFERENCE SIGNS

Figure 1:
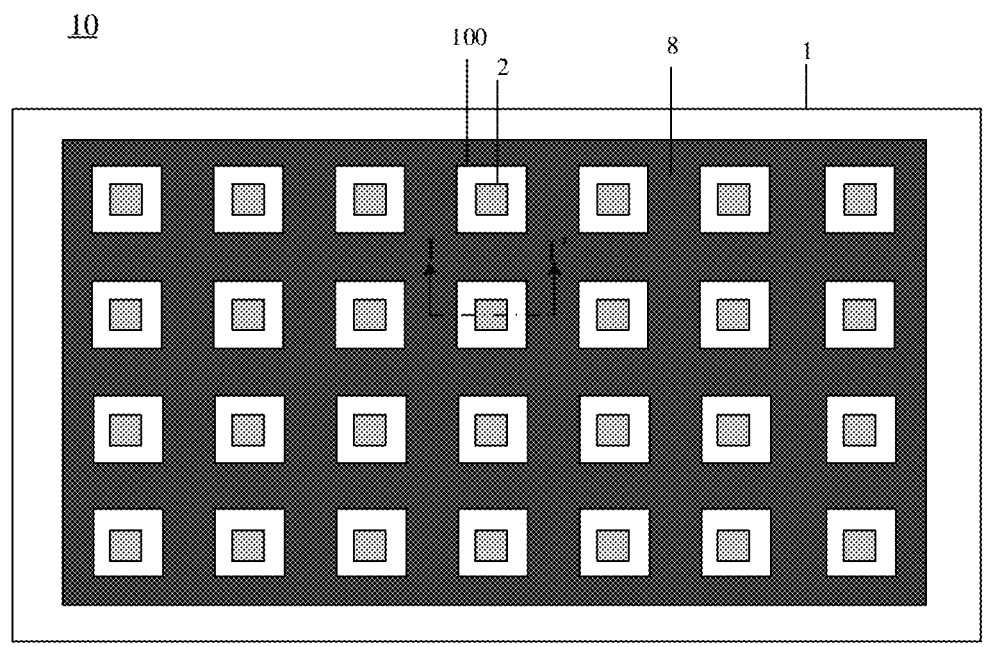
FIG. 1 is a schematic plan view of an array substrate provided by an embodiment of the present disclosure.

1—base substrate; 2—light emitting device; 21—first terminal; 22—light-emitting layer; 23—second terminal; 241—first terminal pin; 242—second terminal pin; 3—thin film transistor; 31—first electrode; 311—first portion of first electrode; 312—second portion of first electrode; 32—second electrode; 33—gate electrode; 34—semiconductor layer; 41—first connection electrode; 411—first portion of first connection electrode; 412—second portion of first connection electrode; 42—second connection electrode; 51—first insulation layer; 52—second insulation layer; 61—first terminal lead; 62—second terminal lead; 7—protrusion; 8—black matrix; 9—gate insulation layer; 10—array substrate; 11—interlayer insulation layer; 12—dual-tone mask; 13—electronic apparatus; 100—array unit; 101—first via hole; 102—second via hole; 200—parallel structure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by those of ordinary skill in the art to which the present disclosure belongs. The terms "first," "second," etc., which are used in the description and the claims of the present disclosure, are not intended to indicate any sequence, amount or importance, but used to distinguish various components. The terms, such as "comprise/comprising," "include/including," or the like are intended to specify that the elements or the objects stated before these terms encompass the elements or the objects and equivalents thereof listed after these terms, but not preclude other elements or objects. The terms, "inside," "outside," "on," "under," or the like are only used to indicate relative position relationship, and when the position of the object which is described is changed, the relative position relationship may be changed accordingly.

The drawings of the present disclosure are not strictly drawn to actual scales; specific sizes and numbers of respective structures may be determined according to actual needs. Only the structures directly related to achievement of corresponding technical effects are illustrated in the drawings of the present disclosure, and for other structures, conventional technologies may be referred to. The drawings described in the present disclosure are merely structural schematic diagrams.

For example, in the present application, a same patterning process refers to a single exposure with one mask.

At least one embodiment of the present disclosure provides an array substrate, the array substrate comprising: a base substrate, a thin film transistor, a first connection electrode and a first insulation layer. A light emitting device is provided on the base substrate; the thin film transistor is provided on the base substrate and comprises a first electrode and a second electrode; the first connection electrode is provided in a different layer from the first electrode and electrically connected with the first electrode; the first insulation layer covers at least a portion of the first connection electrode; an area of an orthographic projection of the first connection electrode on the base substrate is larger than an area of an orthographic projection of the first electrode on the base substrate; and the first insulation layer is made of an organic insulation material. For example, the base substrate further comprises a light emitting device; the light emitting device is provided on the base substrate; and the first electrode is connected with the light emitting device through the first connection electrode. For example, the first insulation layer is located between the first connection electrode and the light emitting device.

Figure 2A:
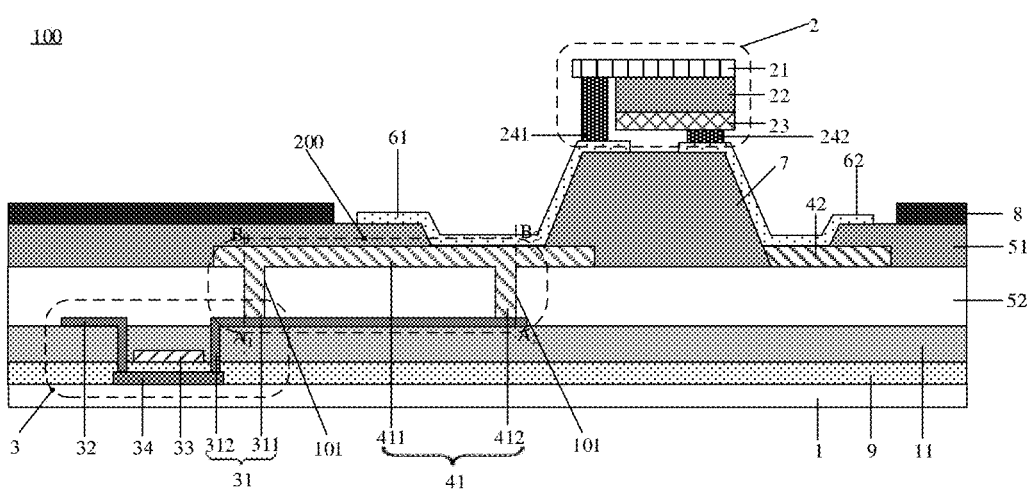
FIG. 2A is a cross-sectional schematic diagram taken along a line I-I' in FIG. 1.
Figure 2B:
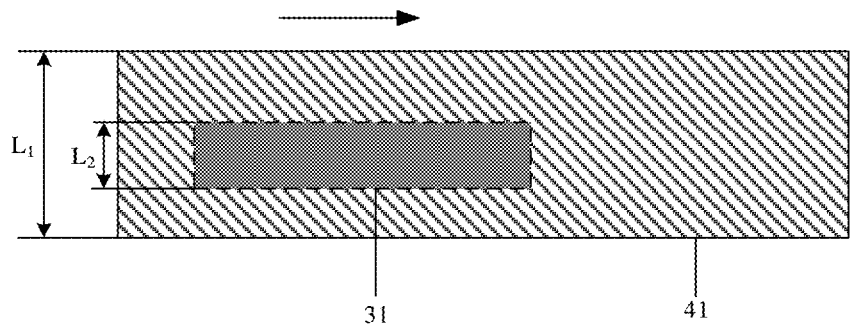
FIG. 2B is a schematic diagram of an orthographic projection of a first connection electrode and an orthographic projection of a first electrode on a base substrate in the array substrate illustrated in FIG. 2A.

Exemplarily, FIG. 1 is a schematic plan view of an array substrate provided by an embodiment of the present disclosure; and FIG. 2A is a cross-sectional schematic diagram taken along a line I-I' in FIG. 1. As illustrated in FIG. 1 and FIG. 2A, the array substrate 100 comprises: a base substrate 1, a light emitting device 2, a thin film transistor 3, a first connection electrode 41 and a first insulation layer 51. The light emitting device 2 is provided on the base substrate 1; the thin film transistor 3 is provided on the base substrate 1 and comprises a first electrode 31 and a second electrode 32. For example, the first electrode 31 is a source electrode, and the second electrode 32 is a drain electrode; or, the first electrode 31 is the source electrode, and the second electrode 32 is the drain electrode. For example, the thin film transistor 3 further comprises a gate electrode 33 and a semiconductor layer 34; and a gate insulation layer 9 is provided between the gate electrode 33 and the semiconductor layer 34 to insulate the gate electrode 33 from the semiconductor layer 34. An interlayer insulation layer 11 is further provided on the base substrate 1 to insulate the gate electrode 33 from the first electrode 31 and the second electrode 32. For example, the thin film transistor is a switch transistor. It should be noted that, in the present disclosure, the feature that the first connection electrode 41 is provided in a different layer from the first electrode 31 refers to that the first connection electrode 41 and the first electrode 31 are respectively provided in different layers; and in a direction perpendicular to the base substrate, there are other layers between the first connection electrode 41 and the first electrode 31. The first electrode 31 is connected with the light emitting device 2 through the first connection electrode 41, that is, the first electrode 31 is connected with the first connection electrode 41, and the first connection electrode 41 is connected with the light emitting device 2. The first insulation layer 51 is between the first connection electrode 41 and the light emitting device 2, and covers a portion of the first connection electrode 41 to insulate the first connection electrode 41 from other components that are not required to be electrically connected with the first connection electrode 41, so as to prevent an electrical signal transmitted through the first connection electrode 41 from being affected. Meanwhile, the first insulation layer can avoid etching a pattern of the first connection electrode when patterning a first terminal 2161; further, the first insulation layer can achieve insulation between the first connection electrode and the black matrix. An area of an orthographic projection of the first connection electrode 41 on the base substrate 1 is larger than an area of an orthographic projection of the first electrode 31 on the base substrate 1, as illustrated in FIG. 2B. For example, a size of the base substrate of the array substrate 10 is 5 inches (for example, the base substrate is a rectangle, and a length of a diagonal line of the rectangle is 5 inches), and the area of the orthographic projection of the first connection electrode 41 on the base substrate 1 occupies 90% of an area of the base substrate of the array substrate. The first insulation layer 51 is made of an organic insulation material. Thus, compared with a case where the first connection electrode 41 is not provided and the first electrode 31 is directly connected with the light emitting device 2, for example, in a case where a current required by the light emitting device 2 is relatively large and the thin film transistors 3 are required to be more densely distributed (for example, when high resolution is required in a display panel) in the array substrate, in the embodiment of the present disclosure, providing the first connection electrode 41 at a different layer from the first electrode 31 supply an electrical signal to the light emitting device 2, for example, by reasonably designing a connection relationship between the first connection electrode 41 and the first electrode 31 and making the area of the orthographic projection of the first connection electrode 41 on the base substrate 1 larger than the area of the orthographic projection of the first electrode 31 on the base substrate 1, can reduce a resistance in a process that the signal is transmitted from the thin film transistor 3 to the light emitting device 2. In this case, the first insulation layer 51 is made of an organic material, and the first insulation layer 51 may be formed by, for example, a coating method in the fabrication process. If the first insulation layer 51 is made of an inorganic material, a method such as chemical vapor deposition (CVD) is usually adopted, while the first connection electrode 41 having a larger area is made of a conductive material such as a metal material; because a plasma gas exists in the CVD process, the first connection electrode 41 having a larger area which is made of the metal material causes an abnormal discharge phenomenon in a CVD apparatus, which damages the apparatus and is also detrimental to a quality of a film formed in the CVD apparatus. Therefore, such a problem can be avoided if the first insulation layer 51 is made of an organic material, and meanwhile, the organic material can achieve better planarization.

For example, the first insulation layer 51 is made of a resin material such as polyimide and polyester, and so on. Polyimide has characteristics of high temperature resistance and excellent bending resistance, and is suitable as a material for fabricating a flexible substrate, which can adapt to an increase in a substrate temperature because heat generation during operation of the light emitting device 2. Of course, the material of the first insulation layer 51 is not limited to the types listed above.

Figure 2C:
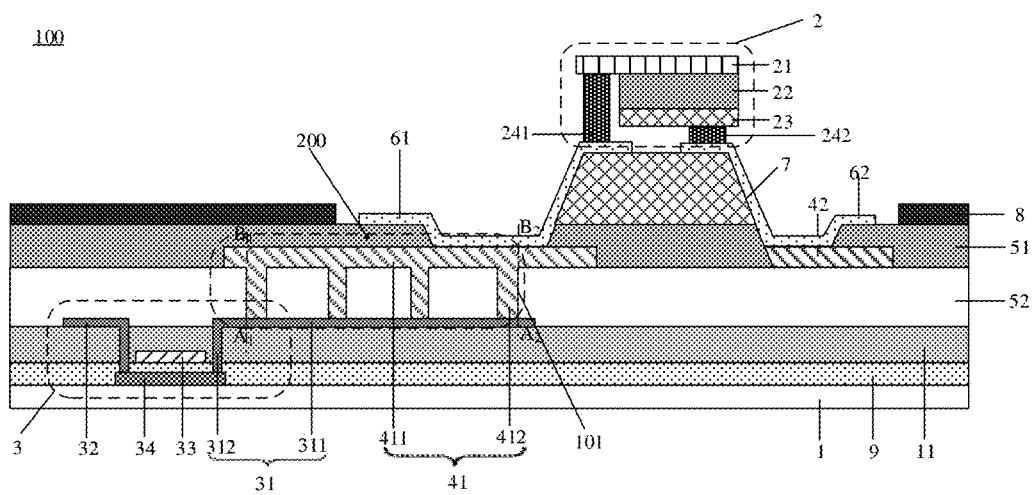
FIG. 2C is another cross-sectional schematic diagram taken along the line I-I' in FIG. 1.

For example, as illustrated in FIG. 2A and FIG. 2C, the first connection electrode 41 comprises a first portion 411 parallel to the base substrate 1 and a second portion 412 having an included angle with the base substrate 1; and the first electrode 31 comprises a first portion 311 parallel to the base substrate 1 and a second portion 312 having an included angle with the base substrate 1. Both the included angle between the second portion 412 of the first connection electrode and the base substrate 1 and the included angle between the second portion 312 of the first electrode and the base substrate 1 are greater than 0° and less than 180°. A first signal is transmitted to the light emitting device 2 through the first electrode 31 and the first connection electrode 41; on a plane parallel to the base substrate 1, a width L1 of the first portion 411 of the first connection electrode in a direction perpendicular to a transmission direction of the first signal (an arrow direction in FIG. 2B) is larger than a width $L_2$ of the first portion 311 of the first electrode 31 in the direction perpendicular to the first signal transmission direction, so that the area of the orthographic projection of the first connection electrode 41 on the base substrate 1 is larger than the area of the orthographic projection of the first electrode 31 on the base substrate 1. The width $L_1$ of the first portion 411 of the first connection electrode is larger than the width $L_2$ of the first portion 311 of the first electrode, which is favorable for reducing a resistance of the first portion 411 of the first connection electrode and increasing a current supplied to the light emitting device 2.

For example, on the plane parallel to the base substrate 1, the width L1 of the first portion 411 of the first connection electrode in the direction perpendicular to the transmission direction of the first signal is larger than 10 μm. A size of the width $L_1$ may be reasonably designed according to a magnitude of the current required by the light emitting device 2, the area of the base substrate 1, and density of arrangement of the thin film transistor 3 and the light emitting device 2.

For example, the array substrate 10 further comprises a second insulation layer 52 to space the thin film transistor 3 apart from the first connection electrode, for example, portions, which are not required to be electrically connected with the first connection electrode 41, of a layer in which the thin film transistor 3 is located are insulated from a layer in which the first connection electrode 41 is located. For example, the second insulation layer 52 is between the thin film transistor 3 and the first connection electrode 41. For example, the second insulation layer 51 comprises a plurality of first via holes 101 exposing the first electrode. The first signal is transmitted to the light emitting device 2 through the first portion 311 of the first electrode, for example, the plurality of first via holes 101 are arranged along a direction in which the first signal is transmitted in the first portion 311 of the first electrode. For example, as illustrated in FIG. 2A, the number of first via holes 101 is two, and the first connection electrode 41 is electrically connected with the first electrode 31 of the thin film transistor through the two first via holes 101, for example, the two first via holes 101 are arranged along the direction in which the first signal is transmitted in the first portion 311 of the first electrode. Thus, the first connection electrode 41 and the first electrode 31 of the thin film transistor form a parallel structure 200 electrically connected with the light emitting device 2. The first connection electrode 41 in the parallel structure 200 (a segment $B_1B_2$ of the first portion 411 of the first connection electrode and the second portion 412 of the first connection electrode located in the two via holes) and the first electrode 31 in the parallel structure 200 (a segment $A_1A_2$ of the first portion 311 of the first electrode) are connected in parallel to reduce a resistance of the electrical signal transmitted from point $A_1$ to point $B_2$, so as to reduce the resistance of a process in which the electrical signal is transmitted from the thin film transistor 3 to the light emitting device 2, and increase a current of the electrical signal transmitted from the thin film transistor 3 to the light emitting device 2. When the current required by the light emitting device 2 is relatively large, a demand for a larger current by the light emitting device 2 can be satisfied.

For example, a resistance of the first connection electrode 41 is smaller than a resistance of the first electrode 31. As affected by the density of arrangement of the thin film transistor 3, a degree of freedom in adjusting the resistance of the first electrode 31 is small; however, the first connection electrode 41 and the first electrode 31 are respectively provided in different layers, a degree of freedom in adjusting the resistance of the first connection electrode 41 is large, therefore it is convenient to reduce the resistance of the first connection electrode 41 so as to reduce a resistance of the entire parallel structure 200. Thus, in the array substrate 10 provided by the embodiment of the present disclosure, the resistance of the first connection electrode 41 can be further reduced conveniently to reduce the resistance of the entire parallel structure 200, so as to increase the current supplied to the light emitting device 2, which can not only satisfy the demand for a large current by the light emitting device 2, but also ensure a high-density arrangement of the thin film transistor 3 and the light emitting device 2.

The embodiment that the resistance of the first connection electrode 41 is smaller than the resistance of the first electrode 31 comprises at least one of cases below: the area of the orthographic projection of the connection electrode 42 on the base substrate 1 is larger than the area of the orthographic projection of the first electrode 31 on the base substrate 1; in a direction perpendicular to the base substrate 1, a thickness of the first connection electrode 41 is larger than a thickness of the first electrode 31; and resistivity of a material of the first connection electrode 41 is smaller than resistivity of a material of the first electrode 31. In any one of the above-described cases, parameters in the other cases remain unchanged; in any two cases of the above-described several cases, the parameters in the other case remain unchanged.

It should be noted that, as illustrated in FIG. 1, the array substrate 10 comprises a plurality of array units 100 arranged in an array; and the comparison between the resistance of the first connection electrode 41 and the resistance of the first electrode 31 is performed within a single array unit 100. The comparison between the area of the orthographic projection of the first connection electrode 41 and the area of the orthographic projection of the first electrode 31 is also performed within a single array unit 100.

For example, as illustrated in FIG. 2A, the array substrate 10 further comprises a second connection electrode 42; the second connection electrode 42 is provided in a same layer as the first connection electrode 41; the first insulation layer 51 further covers a portion of the second connection electrode 42; and an area of an orthographic projection of the connection electrode 42 on the base substrate is larger than the area of the orthographic projection of the first electrode 31 on the base substrate. The light emitting device 2 comprises a first terminal 21, a light-emitting layer 22 and a second terminal 23; the first connection electrode 41 is electrically connected with the first terminal 21; and the second connection electrode 42 is electrically connected with the second terminal 23. For example, the first insulation layer 51 exposes a portion of the first connection electrode 41 and a portion of the second connection electrode 42; and the light emitting device 2 comprises a first terminal pin 241 and a second terminal pin 242. The array substrate further comprises a first terminal lead 61 and a second terminal lead 62. The first terminal lead 61 is connected with the portion of the first connection electrode 41 exposed by the first insulation layer 51; and the first terminal lead 61 is connected with the first terminal pin 241, so that the first connection electrode 41 is electrically connected with the first terminal 21 sequentially through the first terminal lead 61 and the first terminal pin 241. The second terminal lead 62 is connected with the portion of the second connection electrode 42 exposed by the first insulation layer 51, and the second terminal lead 62 is connected with the second terminal pin 242, so that the second connection electrode 42 is electrically connected with the second terminal 22 sequentially through the second terminal lead 62 and the second terminal pin 242. That is, the first connection electrode 41 is electrically connected with the first terminal 21 through the first terminal lead 61 and the first terminal pin 241, and the second connection electrode 42 is electrically connected with the second terminal 22 through the second terminal lead 62 and the second terminal pin 242. For example, the first connection electrode 41 transmits the first signal from the second electrode of the thin film transistor 3 to the first terminal 21 of the light emitting device 2; the second connection electrode 42 is connected with a low voltage signal line, and a low voltage signal as a second signal is transmitted from the second connection electrode 42 to the light emitting device 2; the light emitting device 2 operates under actions of the first signal and the second signal; and operation situations of the light emitting device 2, such as whether to emit light, luminous intensity, and so on, are controlled by the first signal and the second signal. For example, the first signal is a high voltage signal, and the second signal is a low voltage signal.

It should be noted that, in the present disclosure, the feature that the second connection electrode 42 and the first connection electrode 41 are provided in a same layer refers to that the second connection electrode 42 and the first connection electrode 41 are formed by patterning a same film layer, for example, formed by performing a same patterning process on a same film layer.

For example, on the plane parallel to the base substrate 1, a width of the second connection electrode 42 in a direction perpendicular to a second signal transmission direction is larger than 10 µm. Thus, the width of the second connection electrode 42 in the direction perpendicular to the second signal transmission direction is relatively large, so that a resistance of the second connection electrode 42 can be reduced, and the current supplied to the light emitting device 2 can be increased, which can further satisfy the demand for a large current by the light emitting device 2.

For example, both the first connection electrode 41 and the second connection electrode 42 are made of a metal material. The metal material comprises, for example, copper, a copper alloy, molybdenum and a molybdenum alloy, etc. Of course, the material of the first connection electrode 41 and the material of the second connection electrode 42 are not limited to the above-described types, and the material of the second connection electrode 42 is not be limited in the embodiment of the present disclosure.

For example, the array substrate 10 further comprises a protrusion 7; the protrusion 7 is located on a side, which is away from the base substrate 1, of the first insulation layer 51; and the light emitting device 2 is provided on the protrusion 7. For example, after the light emitting device 2 is formed, the light emitting device 2 is provided at a predetermined position of the array substrate 10, for example, the light emitting device 2 is bonded to the predetermined position of the array substrate 10. In the process of placing the light emitting device 2, the protrusion 7 can assist in identifying the predetermined position, so that the position of the light emitting device 2 is more precise. The higher the density of arrangement of the light emitting device 2, the higher the positional precision of the light emitting device 2 that is required to prevent a problem of interference between adjacent light emitting devices 2 and a problem of local uneven light emission, etc. For example, an upper surface, which is away from the base substrate 1, of the protrusion 7 is a flat surface so as to facilitate arrangement of the light emitting device 2 on the upper surface.

For example, in one embodiment, as illustrated in FIG. 2A, the protrusion 7 and the first insulation layer 51 are integral, so as to simplify a fabrication process of the array substrate 10. In the present disclosure, the feature that the protrusion 7 and the first insulation layer 51 are integral refers to that the protrusion 7 and the first insulation layer 51 are formed by performing a same patterning process on a same material layer; and that a protrusion 7 and a first insulation layer 51 are integrally formed refers to that the protrusion 7 and the first insulation layer 51 are made of a same material, and the protrusion 7 and the first insulation layer 51 constitute an integral structure without seams.

For example, in another embodiment, the protrusion 7 and the first insulation layer 51 are not integral, as illustrated in FIG. 2C. The protrusion 7 is not integral with the first insulation layer 51; the protrusion 7 is formed on the first insulation layer 51 after the first insulation layer 51 is formed.

For example, in the embodiment of the present disclosure, the light emitting device 2 is a light emitting diode. For example, the light emitting device 2 is a small light emitting diode or a micro light emitting diode (Micro LED). At this time, for example, the first terminal is an anode, and the second terminal is a cathode, or, the first terminal is the cathode, and the second terminal is the anode. For example, each light emitting device 2 is independently driven, which requires a current larger than that required by a conventional light emitting diode; both the small light emitting diode or the Micro LED have a small size, and can be arranged at a high density, which requires relatively high density of arrangement of thin film transistors, electrodes and signal lines, etc., that supply an electrical signal to the small light emitting diode or the Micro LED device; therefore the array substrate provided by the embodiment of the present disclosure can further ensure arrangement of high density while supplying a higher current to the small light emitting diode or the Micro LED device. For example, in a case where the array substrate 10 is applied to the display panel, such high-density arrangement can achieve high display resolution.

Figure 3:
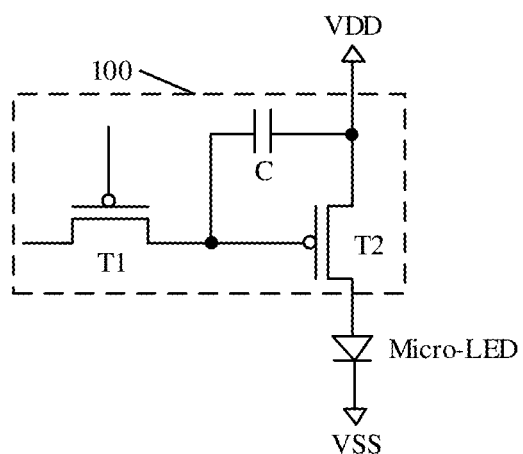
FIG. 3 is a structural schematic diagram of a driving circuit of an array unit in the array substrate provided by the embodiment of the present disclosure.

For example, in a case where the light emitting device 2 is a light emitting diode, an internal circuit structure of the array unit 100 may be a frequently-used 2T1C structure. FIG. 3 is a structural schematic diagram of a driving circuit of the array unit in the array substrate provided by the embodiment of the present disclosure. As illustrated in FIG. 3, driving components of the array unit 100 may comprise a switch transistor T1, a driving transistor T2 and a capacitor C. For example, the driving transistor T2 is the thin film transistor 3 according to the above-described embodiments. A second electrode of the switch transistor T1, a control electrode of the driving transistor T2 and a first electrode plate of the capacitor C are respectively connected with one another; a second electrode plate of the capacitor C and a first electrode of the driving transistor T2 are respectively connected with a power terminal VDD; a second electrode of the driving transistor T2 is connected with a positive electrode of the light emitting diode Micro-LED; and a negative electrode of the Micro-LED is connected with a power terminal VSS.

As illustrated in FIG. 2A and FIG. 2B, the array substrate 10 further comprises an opaque black matrix 8; and the black matrix 8 is among the plurality of array units 100 to prevent crosstalk of light emitted from light emitting devices 2 of adjacent array units 100. A gap is between the black matrix 8 and the first terminal lead 61, and a gap is between the black matrix 8 and the second terminal lead 62, so that the black matrix 8 is not in contact with the first terminal lead 61 and the second terminal lead 62. Because a resistance of a usual material (for example, an organic insulation material containing a light-shielding material) of the black matrix 8 is relatively large, the black matrix 8 can be prevented from being contact with the first terminal lead 61 and the second terminal lead 62, so as to avoid increasing a resistance of a circuit for supplying the electrical signal to the light emitting device 2. Or, in a case where the black matrix 8 is made of a conductive material, if the black matrix 8 is in contact with the first terminal lead 61 and the second terminal lead 62, it can cause interference to the signal transmitted to the light emitting device through the first terminal lead 61 and the second terminal lead 62.

As illustrated in FIG. 2C, the second insulation layer 51 comprises more than two first via holes 101, for example, the number of via holes is four; of course, the number of first via holes 101 is not limited to four. The first connection electrode 41 is electrically connected with the first electrode 31 of the thin film transistor through the four via holes 101. For example, the four first via holes 101 are arranged along the direction in which the first signal is transmitted in the first portion 311 of the first electrode. Thus, the first connection electrode 41 and the first electrode 31 of the thin film transistor form the parallel structure 200 electrically connected with the light emitting device 2. The first connection electrode 41 in the parallel structure 200 (the segment $B_1B_2$ of the first portion 411 of the first connection electrode and the second portion 412 of the first connection electrode located in the four via holes) and the first electrode 31 in the parallel structure 200 (the segment $A_1A_2$ of the first portion 311 of the first electrode) are connected in parallel to reduce the resistance of the electrical signal transmitted from point $A_1$ to point $B_2$, so as to reduce the resistance of the electrical signal transmitted from the thin film transistor 3 to the light emitting device 2, and increase a current of the electrical signal transmitted from the thin film transistor 3 to the light emitting device 2. When the current required by the light emitting device 2 is relatively large, the demand for a larger current by the light emitting device 2 can be satisfied. Other features of the embodiment in FIG. 2C are all the same as those of the embodiment illustrated in FIG. 2A, please refer to the previous description.

At least one embodiment of the present disclosure further provides an electronic apparatus, the electronic apparatus comprising any one of the array substrates provided by the embodiments of the present disclosure.

Figure 4:
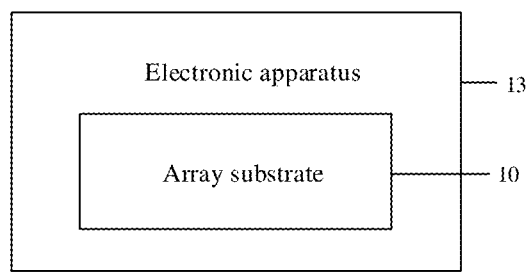
FIG. 4 is a schematic diagram of an electronic apparatus provided by an embodiment of the present disclosure.

FIG. 4 is a schematic diagram of an electronic apparatus provided by an embodiment of the present disclosure. For example, as illustrated in FIG. 4, at least one embodiment of the present disclosure further provides an electronic apparatus 13, the electronic apparatus 13 comprising any one of the array substrates 10 provided by the embodiments of the present disclosure. The electronic apparatus 13 can not only satisfy a demand for a larger current by a light emitting device, but also ensure high-density arrangement of a thin film transistor and the light emitting device.

For example, the electronic apparatus 13 may be a display device (e.g., a Micro-LED display device, an OLED display device/an inorganic electroluminescence display device, etc.); for example, the electronic apparatus 13 may be a mobile phone, a tablet personal computer, a television, a monitor, a laptop, a digital photo frame, a navigator, and other product or component having a display function. For example, the electronic apparatus 13 may also be a lighting device (e.g., a Micro-LED lighting device and an OLED lighting device, etc.), for example, a lighting fixture, a decorative lantern, etc. Of course, a type of the electronic apparatus will not be limited in the embodiment of the present disclosure.

It should be noted that, FIG. 4 is only a schematic diagram of an electronic apparatus comprising any one of package structures provided by the embodiments of the present disclosure; and for other structures not illustrated in the electronic apparatus, those skilled in the art may refer to conventional technologies, which is not be limited in this embodiment.

At least one embodiment of the present disclosure further provides a fabrication method of an array substrate, the method comprising: providing a base substrate; forming a thin film transistor on the base substrate, wherein the thin film transistor comprising a first electrode and a second electrode; forming a first connection electrode on the base substrate, wherein the first connection electrode is in a different layer from the first electrode and is electrically connected with the first electrode; and forming a first insulation layer covering at least a portion of the first connection electrode, in which on a plane parallel to the base substrate, an area of the first connection electrode is larger than an area of the first electrode; and the first insulation layer is made of an organic insulation material.

Figure 5A:
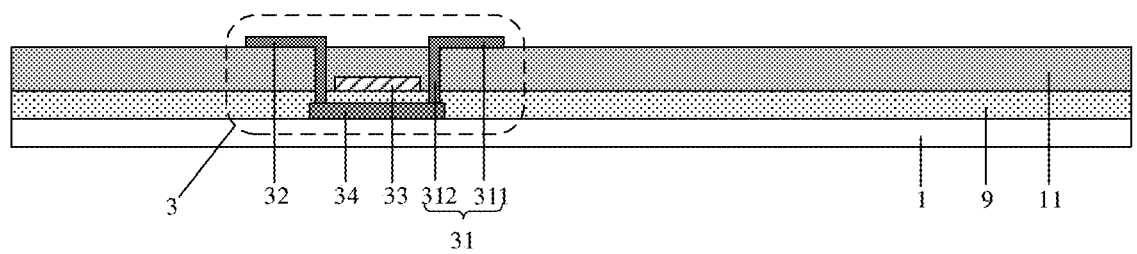
FIG. 5A to FIG. 5J are schematic diagrams of a fabrication method of an array substrate provided by an embodiment of the present disclosure.

Exemplarily, FIG. 5A to FIG. 5J are schematic diagrams of a fabrication method of an array substrate provided by an embodiment of the present disclosure. As illustrated in FIG. 5A, a base substrate 1 is provided; a thin film transistor 3 is formed on the base substrate 1; and the thin film transistor 3 includes a semiconductor layer 34, a first electrode 31 and a second electrode 32 electrically connected with the semiconductor layer 34, and a gate electrode 33. The first electrode 31 includes a first portion 311 parallel to the base substrate 1 and a second portion 312 having an included angle with the base substrate 1. The included angle between the second portion 312 of the first electrode and the base substrate 1 is greater than 0° and less than 180°. The fabrication method of the array substrate further comprises forming a gate insulation layer 9 on the base substrate 1 to insulate the gate electrode 33 from the semiconductor layer 34; and forming an interlayer insulation layer 11 on the base substrate 1 to insulate the gate electrode 33 from the first electrode 31 and the second electrode 32.

Figure 5B:
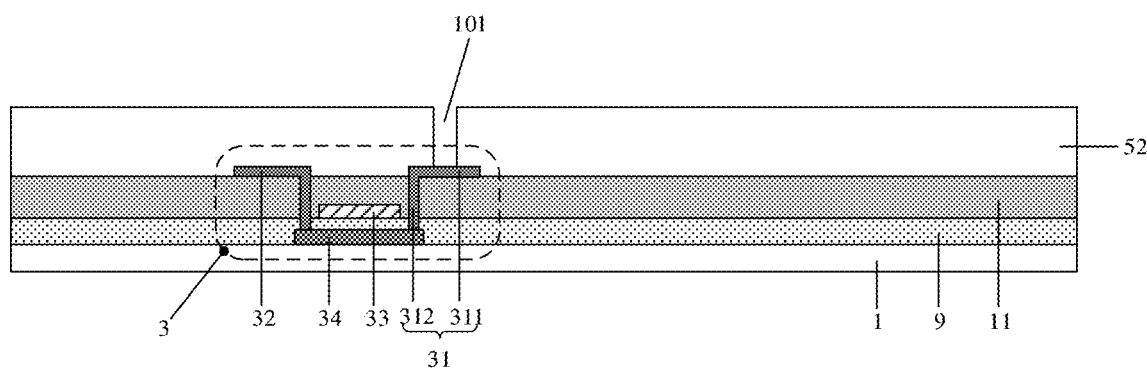

As illustrated in FIG. 5B, a second insulation layer 52 is formed; the second insulation layer 52 covers the thin film transistor 3; and the second insulation layer 52 comprises a first via hole 101 exposing the first electrode 31. For example, the second insulation layer 52 is made of an organic material or an inorganic material. For example, the second insulation layer 52 is formed by a coating method or a deposition method, and the specific method may be selected according to the material of the second insulation layer 52.

For example, the fabrication method of the array substrate further comprises: forming a second connection electrode; the second connection electrode and the first connection electrode are formed by a same patterning process with a same mask; the first insulation layer further covers at least a portion of the second connection electrode; and an area of an orthographic projection of the first connection electrode on the base substrate is larger than an area of an orthographic projection of the first electrode on the base substrate.

Figure 5C:
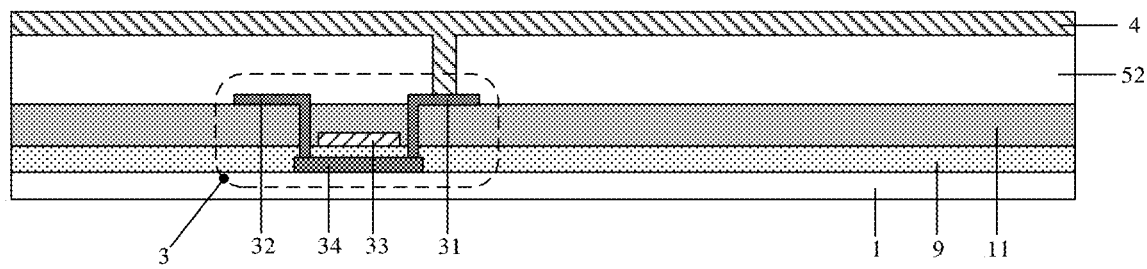

As illustrated in FIG. 5C, a first connection electrode layer 4 is formed on a side, which is away from the base substrate 1, of the second insulation layer 52 for subsequently forming the first connection electrode 41 and the second connection electrode 42. For example, the first connection electrode layer 4 is made of a metal material. The metal material comprises, for example, copper, a copper alloy, molybdenum and a molybdenum alloy, etc. For example, the first connection electrode layer 4 is formed by a chemical vapor deposition (CVD) or magnetron sputtering method. Those skilled in the art can control a thickness of the first connection electrode layer 4 as required.

Figure 5D:
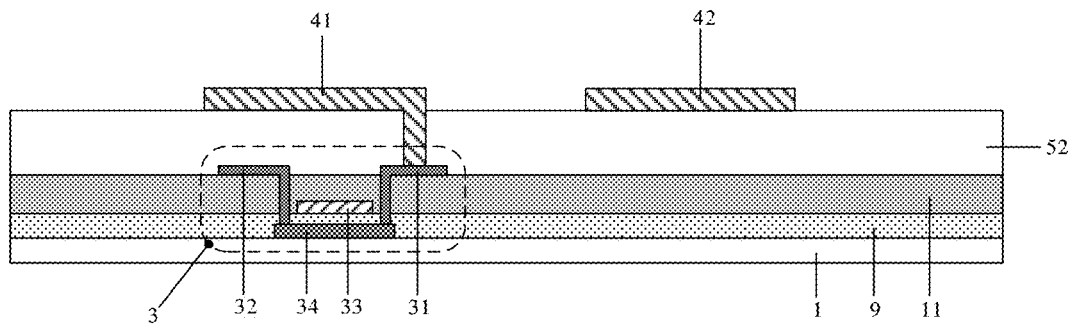

As illustrated in FIG. 5D, the first connection electrode layer 4 is subjected to a same patterning process with a same mask to form the first connection electrode 41 and the second connection electrode 42. For example, the first connection electrode layer 4 is subjected to a same exposure with a same mask, and then subjected to a development process or a development-etching process to form the first connection electrode 41 and the second connection electrode 42. Compared with a case where the first connection electrode 41 and the second connection electrode 42 are sequentially formed respectively by two patterning processes, it is favorable for simplifying the fabrication process of the array substrate and improving production efficiency. Thus, the first connection electrode 41 and the first electrode 31 are provided in different layers. The area of the orthographic projection of the first connection electrode 41 on a plane parallel to the base substrate 1 is larger than the area of the orthographic projection of the first electrode 31 on the plane parallel to the base substrate 1. For example, an area of the orthographic projection of the second connection electrode 42 on the plane parallel to the base substrate 1 is larger than the area of the first electrode 31 on the plane parallel to the base substrate 1. Detailed description of the area relationships and the corresponding technical effects can be referred to the previous description, and are not repeated here.

Figure 5E:
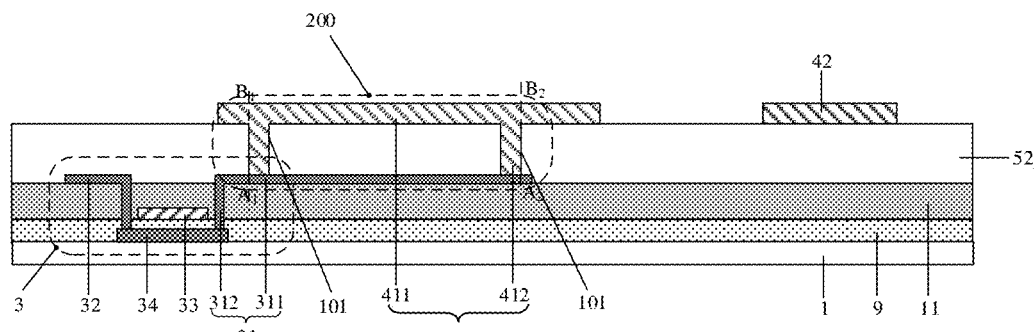

FIG. 5E is a cross-sectional view in another direction which is perpendicular to the direction in which the cross section of the array substrate illustrated in FIG. 5D is located. As illustrated in FIG. 5E, when forming the first via hole 101, a plurality of first via holes 101 exposing the first electrode 31 are formed. A first signal is transmitted to the light emitting device through the first portion 311 of the first electrode; for example, the plurality of first via holes 101 are arranged along a direction in which the first signal is transmitted in the first portion 311 of the first electrode. For example, as illustrated in FIG. 5E, the number of first via holes 101 is two; and the first connection electrode 41 is electrically connected with the first electrode 31 of the thin film transistor through the two first via holes 101, for example, the two first via holes 101 are arranged along the direction in which the first signal is transmitted in the first portion 311 of the first electrode. Of course, in other implementations, the number of first via holes 101 is not limited to two, and may also be, for example, three, four, and so on. Thus, the first connection electrode 41 and the first electrode 31 of the thin film transistor form a parallel structure 200 electrically connected with the light emitting device. The first connection electrode 41 in the parallel structure 200 (a segment $B_1B_2$ of the first portion 411 of the first connection electrode and the second portion 412 of the first connection electrode located in the two first via holes) and the first electrode 31 in the parallel structure 200 (a segment $A_1A_2$ of the first portion 311 of the first electrode) are connected in parallel to reduce a resistance of an electrical signal transmitted from point $A_1$ to point $B_2$, so as to reduce the resistance of the electrical signal transmitted from the thin film transistor 3 to the light emitting device, and increase a current of the electrical signal transmitted from the thin film transistor 3 to the light emitting device. In a case where the current required by the light emitting device is relatively large, a demand for a larger current by the light emitting device can be satisfied.

Figure 5F:
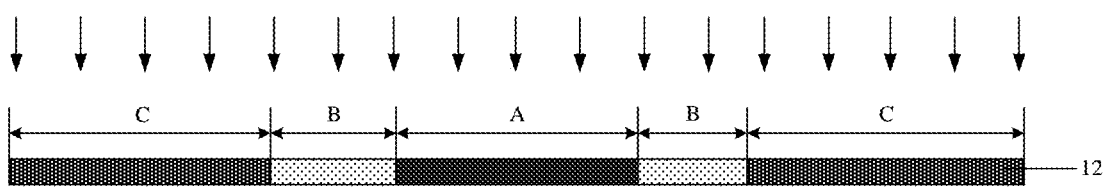
Figure 5F:
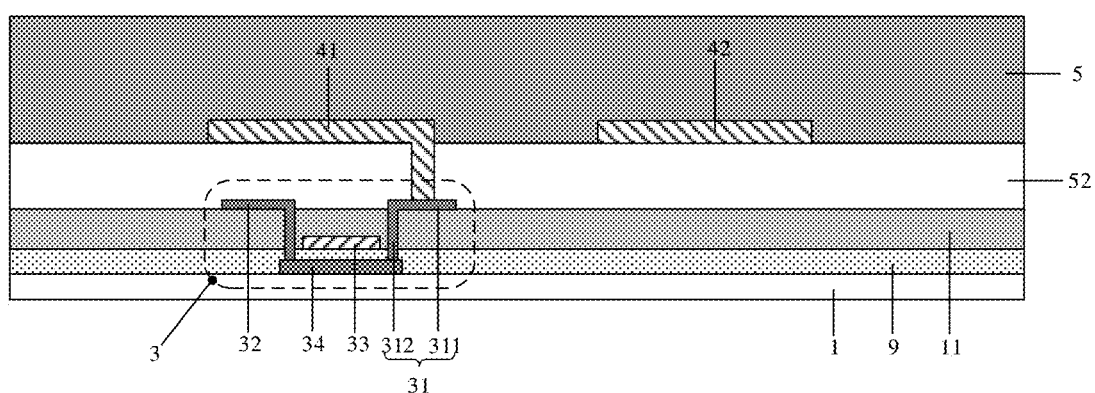

As illustrated in FIG. 5F, the fabrication method further comprises forming a first insulation material layer 5 covering the first connection electrode 41 and the second connection electrode 42 by an organic insulation material by a coating method, and subsequently forming the first insulation layer using the first insulation material layer 5. In this case, the first insulation layer 51 is made of an organic material, and the first insulation material layer 5 is formed by, for example, a coating method in the fabrication process. If the first insulation layer 51 is made of an inorganic material, a method such as chemical vapor deposition (CVD) is usually used; if the first connection electrode 41 having a larger area is made of a conductive material such as a metal material, a plasma gas exists in the CVD process, the first connection electrode 41 having a larger area which is made of a metal material can cause an abnormal discharge phenomenon in a CVD apparatus, which damages the apparatus and is also detrimental to a quality of a film formed in the CVD apparatus. Therefore, this problem can be avoided by fabricating the first insulation material layer 5 by an organic material and forming the first insulation material layer 5 by the coating method.

For example, the fabrication method of the array substrate further comprises: forming the light emitting device on the base substrate, in which the light emitting device is provided on the base substrate, and the first electrode is connected with the light emitting device through the first connection electrode.

For example, the fabrication method of the array substrate further comprises: forming a protrusion on a side, which is away from the base substrate, of the first insulation layer; and forming the light emitting device on the protrusion.

Figure 5G:
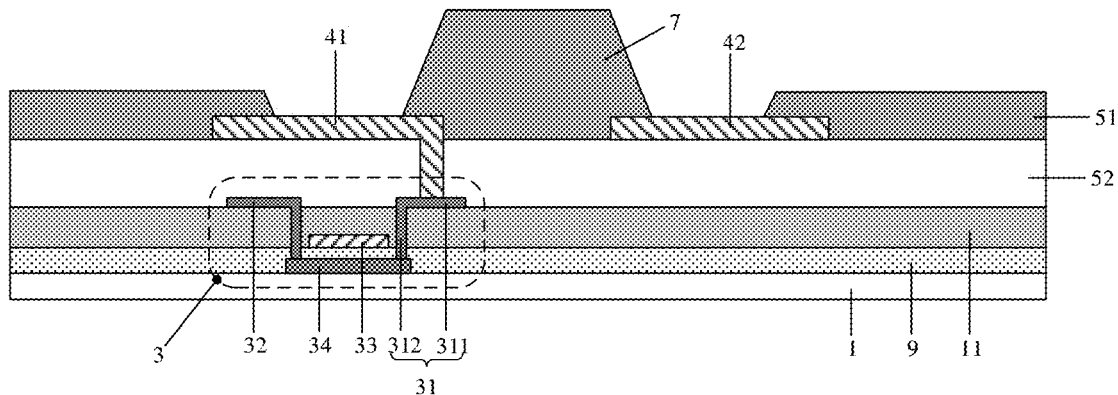

As illustrated in FIG. 5F to FIG. 5G, the first insulation material layer 5 is subjected to a same patterning process with a same dual-tone mask 12 to form the first insulation layer 51 and the protrusion 7. For example, the first insulation layer 51 and the protrusion 7 are formed by a same exposure process. For example, it is introduced below by taking a case where the first insulation material layer 5 comprises a photoresist material and the photoresist material is positive photoresist as an example. The dual-tone mask 11 comprises a non-exposed region A, a fully-exposed region B, and a partially-exposed region C, respectively corresponding to a regions of the first insulation material layer 5 that are used for forming the protrusion, the first insulation layer 51, and the second via holes 102 exposing the first connection electrode 41 and the second connection electrode 42. Further, through a development process, the first insulation layer 51 and the protrusion 7 as illustrated in FIG. 5G are obtained. The first insulation layer 51 covers a portion of the first connection electrode 41 and a portion of the second connection electrode 42, and comprises the second via holes 102 exposing the first connection electrode 41 and the second connection electrode 42. That is, the first insulation layer and the protrusion are formed by a same exposure process with a same dual-tone mask, so as to simplify the fabrication process of the array substrate. For example, in the process of forming the first insulation material layer 5, a thickness of the first insulation material layer 5 may be controlled so that its thickness satisfies a requirement of forming the protrusion 7.

For example, the dual-tone mask may be a gray tone mask or a half tone mask.

For example, in a case where the first insulation material layer 5 does not comprise a photoresist material, the fabrication method further comprises forming photoresist on the first insulation material layer 5 and etching the first insulation material layer 5 after the developing step.

Figure 5H:
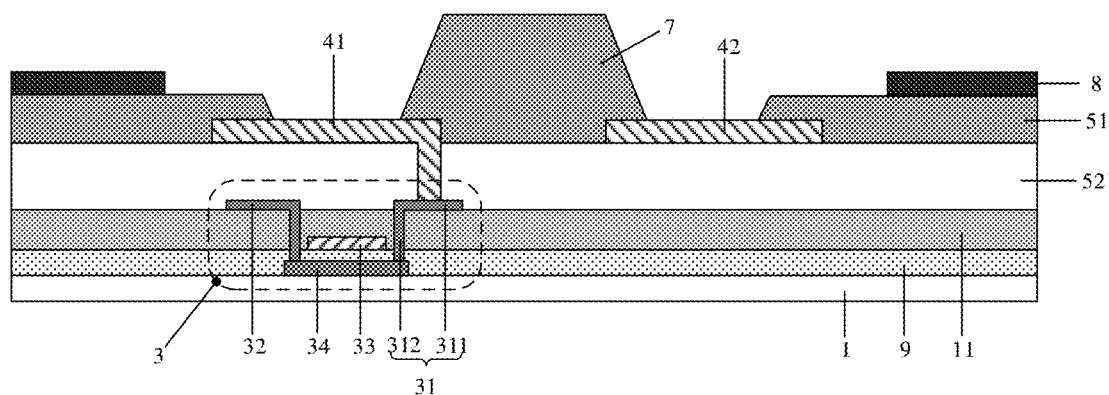

As illustrated in FIG. 5H, the fabrication method of the array substrate further comprises forming a black matrix 8; the black matrix 8 is among the plurality of array units 100, to prevent crosstalk of light emitted from light emitting devices 2 of adjacent array units 100. A gap is between the black matrix 8 and the first terminal lead 61, and a gap is between the black matrix 8 and the second terminal lead 62, so that the black matrix 8 is not in contact with the first terminal lead 61 and the second terminal lead 62, which can prevent increase of a resistance of a circuit for supplying the electrical signal to the light emitting device 2 caused by contact of the black matrix 8 with the first terminal lead 61 and the second terminal lead 62. The black matrix 8 is made of, for example, an opaque organic material, for example, the black matrix 8 is formed by a coating process and patterning process.

Figure 5I:
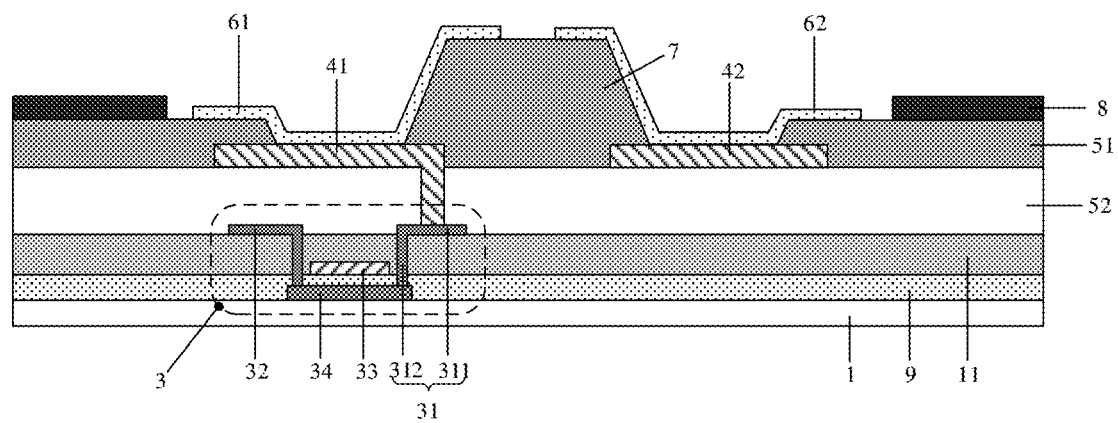

As illustrated in FIG. 5I, the first terminal lead 61 and the second terminal lead 62 are formed. The first terminal lead 61 is connected with the first connection electrode 41 exposed by the first insulation layer 51, and the second terminal lead 62 is connected with the second connection electrode 42 exposed by the first insulation layer 51. In addition, the first terminal lead 61 and the second terminal lead 62 are located on the protrusion 7; and a portion of the first terminal lead 61 and a portion of the second terminal lead 62 are located on an upper surface, which is away from the base substrate 1, of the protrusion 7. For example, the upper surface of the protrusion 7 is a flat surface, which is favorable for subsequent formation of the light emitting device on the upper surface.

Figure 5J:
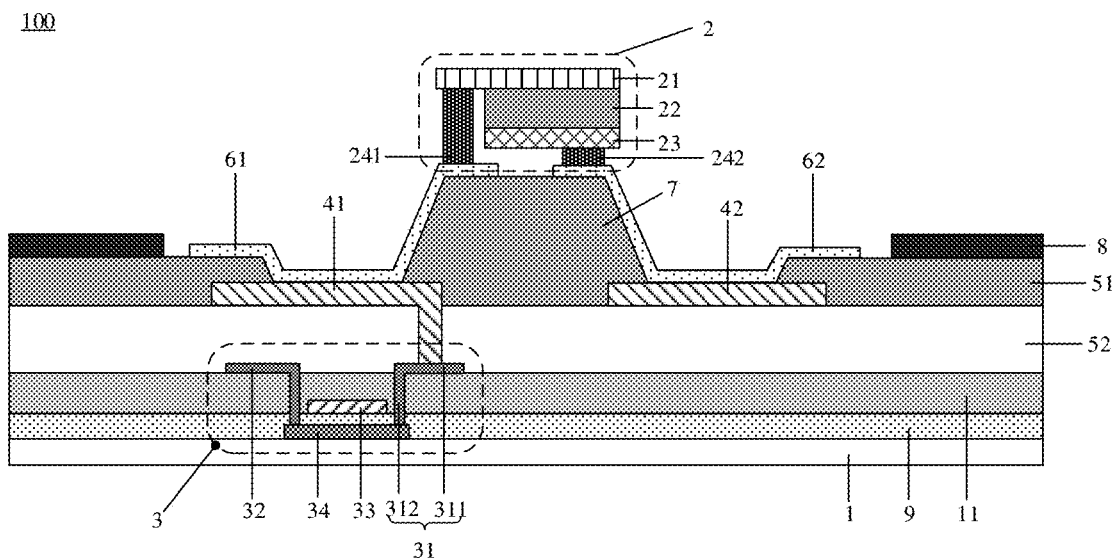

For example, the light emitting device 2 is formed, and then the light emitting device 2 is provided at a predetermined position of the array substrate 10, for example, the light emitting device 2 is bonded to the predetermined position of the array substrate 10. As illustrated in FIG. 5J, the light emitting device 2 is provided on the protrusion 7, for example, the light emitting device 2 is provided on the upper surface of the protrusion 7, so that the first insulation layer 51 is located between the first connection electrode 41 and the light emitting device 2. The light emitting device 2 comprises a first terminal pin 241 and a second terminal pin 242. The first terminal lead 61 is connected with the first terminal pin 241 so that the first connection electrode 41 is electrically connected with the first terminal 21 sequentially through the first terminal lead 61 and the first terminal pin 241, and the first electrode 31 is connected with the light emitting device 2 through the first connection electrode 41. The second terminal lead 62 is connected with the second terminal pin 242 so that the second connection electrode 42 is electrically connected with the second terminal 22 sequentially through the second terminal lead 62 and the second terminal pin 242. For example, in the process of placing the light emitting device 2, it is necessary to identify the predetermined position, the protrusion 7 can assist in identifying the predetermined position, and the predetermined position can be identified more precisely by identifying the position of the protrusion 7, so that the position of the light emitting device 2 is more precise. The higher the density of arrangement of the light emitting device 2, the higher the positional precision of the light emitting device 2 that is required to prevent a problem of interference between adjacent light emitting devices 2 and a problem of local uneven light emission, etc.

The technical effects of the array substrate formed by the fabrication method of the array substrate can be referred to the description in the previous embodiments, and are not repeated here.

Figure 6A:
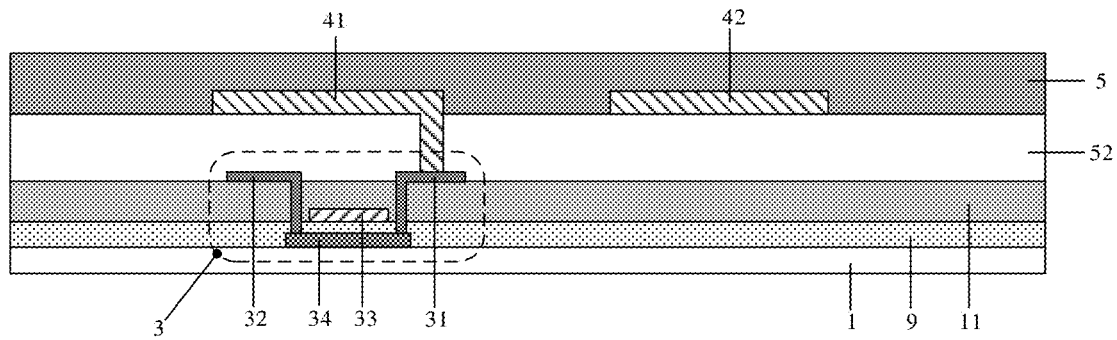
FIG. 6A to FIG. 6G are schematic diagrams of another fabrication method of an array substrate provided by an embodiment of the present disclosure.

For example, FIG. 6A to FIG. 6G are schematic diagrams of another fabrication method of an array substrate provided by an embodiment of the present disclosure; the fabrication method differs from the embodiment illustrated in FIG. 5A to FIG. 5I in forming the first insulation layer by a same patterning process with a first mask and forming the protrusion by a same patterning process with a second mask. As illustrated in FIG. 6A, after the steps illustrated in FIG. 5A to FIG. 5D are completed, a first insulation material layer 5 is formed for subsequent formation of the first insulation layer 51; for example, a thickness of the first insulation material layer 5 is smaller than the thickness of the first insulation material layer 5 in FIG. 5F. A method for forming the first insulation material layer 5 is the same as that in FIG. 5F, please refer to the previous description.

Figure 6B:
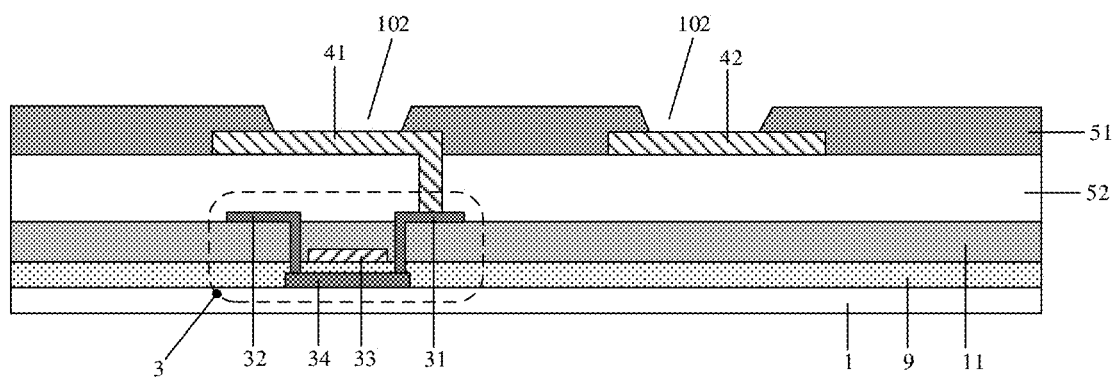

As illustrated in FIG. 6B, the first insulation layer 51 is formed by a same patterning process with the first mask (not illustrated). For example, after the first insulation material layer 5 is sequentially exposed and developed, or exposed, developed and etched, the first insulation layer 51 is formed; and the first insulation layer 51 comprises second via holes 102 exposing the first connection electrode 41 and the second connection electrode 42. For example, the mask is a single tone mask.

Figure 6C:
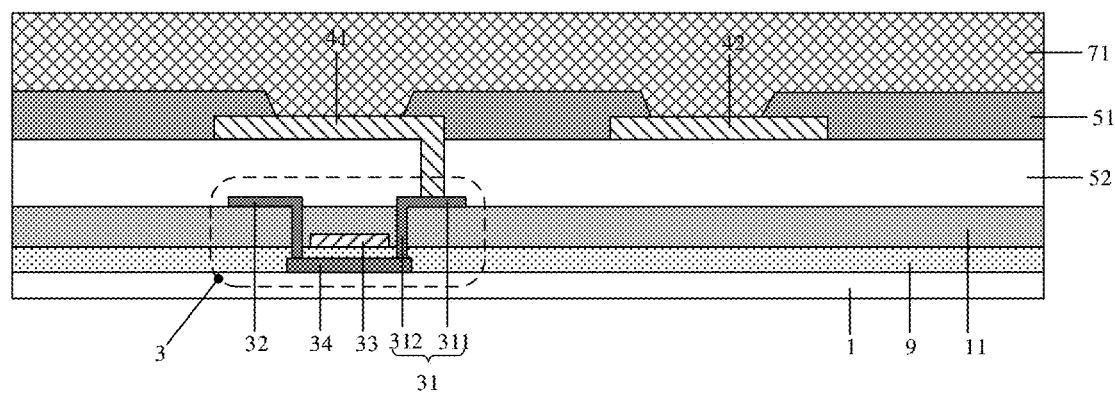

As illustrated in FIG. 6C, a protrusion material layer 71 covering the first insulation layer 51 is formed, and the protrusion material layer 71 is used for subsequently forming the protrusion. For example, the protrusion material layer 71 is made of an organic material. The material of the protruding material layer 71 may be different from the material of the first insulation layer 51, or may also be the same as the material of the first insulation layer 51.

Figure 6D:
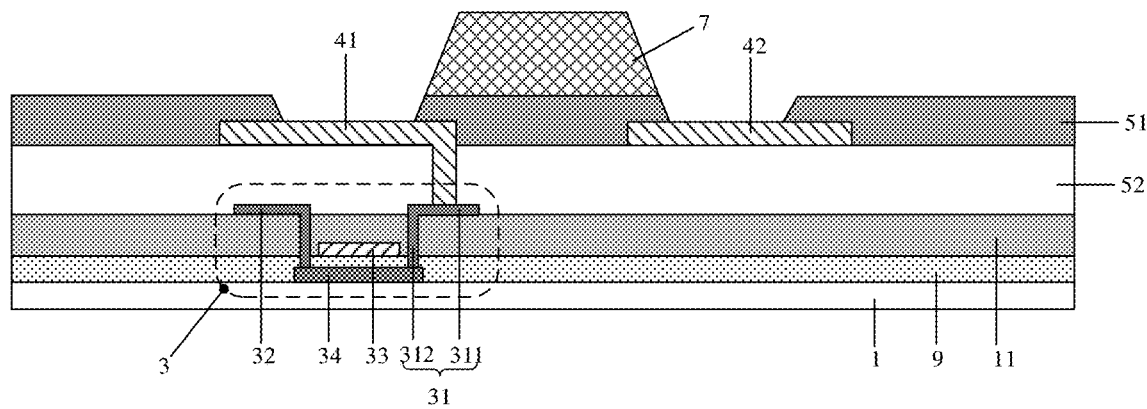

As illustrated in FIG. 6D, the protrusion 7 is formed by a same patterning process with a second mask (not illustrated). For example, the protrusion material layer 71 is subjected to a patterning process (for example, a photoetching process, and for example, a photoetching process with a single tone mask) in cooperation with the second mask, to obtain the protrusion 7. Structural features of the protrusion 7 are the same as those in the previous embodiment. In a case where the material of the protrusion material layer 71 is the same as the material of the first insulation layer 51, in the patterning process of the protrusion material layer 71, when etching the protrusion material layer 71, a thickness of the protrusion material layer 71 removed may be controlled to prevent the first insulation layer 51 from being overetched. For example, it may be achieved by controlling etching time and an etching rate, etc., and may be achieved by those skilled in the art according to technologies commonly used in the art.

Figure 6E:
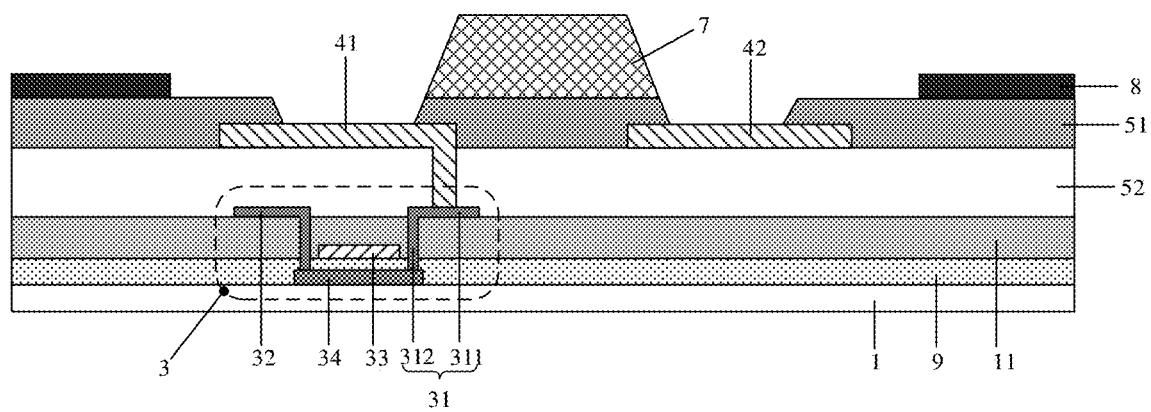
Figure 6F:
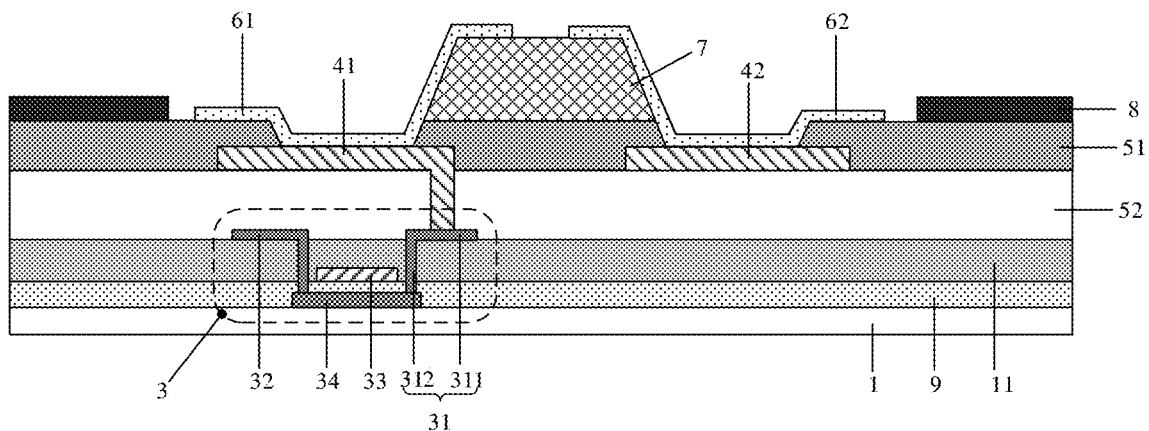
Figure 6G:
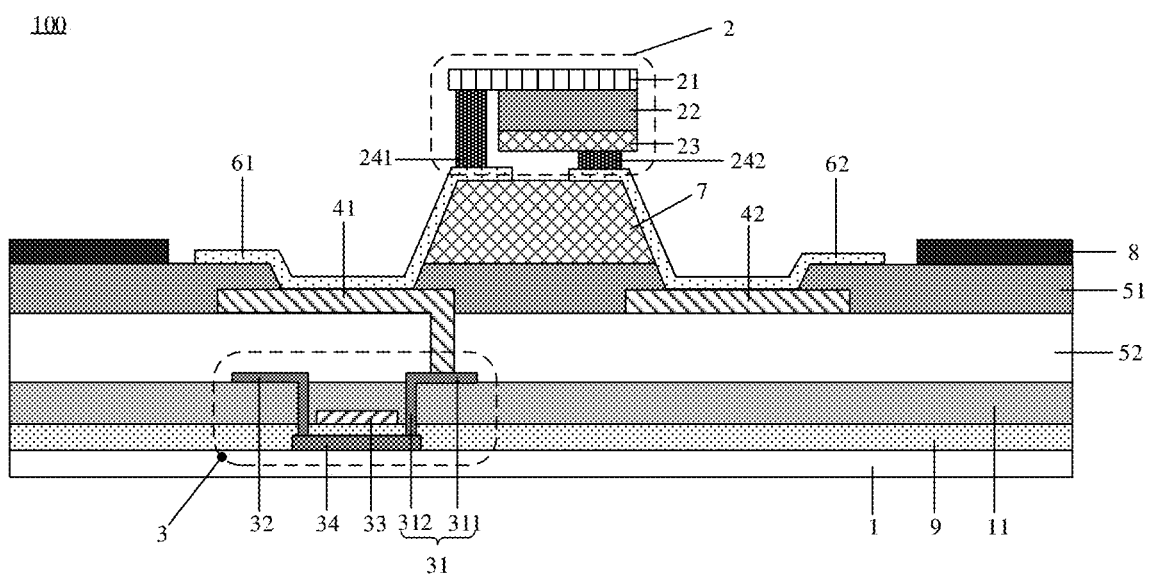

Then, steps illustrated in FIG. 6E to FIG. 6G are performed to obtain the array substrate. These steps are respectively the same as those illustrated in FIG. 5H to FIG. 5G, please refer to the descriptions of FIG. 5H to FIG. 5G.

The above description is merely an exemplary implement of the present disclosure and is not intended to limit the scope of the present disclosure, which is determined according to the scope defined by the accompanying claims. Those skilled in the art may make changes, modifications, substitutions and variations to the above embodiments within the scope of this disclosure.

What is claimed is:

1. An array substrate, comprising:
   a base substrate;
   a thin film transistor on the base substrate and comprising a first electrode and a second electrode;
   a first connection electrode in a layer different from the first electrode and electrically connected with the first electrode; and
   a first insulation layer covering at least a portion of the first connection electrode,
   wherein an area of an orthographic projection of the first connection electrode on the base substrate is larger than an area of an orthographic projection of the first electrode on the base substrate, and
   wherein the first insulation layer is made from an organic insulation material,
   the array substrate further comprises:
   a light emitting device, wherein the light emitting device is on the base substrate, and the first electrode is connected with the light emitting device through the first connection electrode; and
   a second connection electrode, wherein the second connection electrode is in a same layer as the first connection electrode, the first insulation layer further covers at least a portion of the second connection electrode, and an area of an orthographic projection of the second connection electrode on the base substrate is larger than the area of the orthographic projection of the first electrode on the base substrate,
   wherein the light emitting device comprises a first terminal, a light-emitting layer and a second terminal, the first connection electrode is electrically connected with the first terminal, and the second connection electrode is electrically connected with the second terminal.

2. The array substrate according to claim 1, wherein a second signal is transmitted from the second connection electrode to the light emitting device; and on a plane parallel to the base substrate, a width of the second connection electrode in a direction perpendicular to a transmission direction of the second signal is larger than 10 μm.

3. The array substrate according to claim 1, wherein the first connection electrode is made from a metal material, and the second connection electrode is made from a metal material.

4. The array substrate according to claim 1, further comprising:
   a plurality of array units arranged in an array, wherein the light emitting device is in a respective one of the plurality of array units; and
   a black matrix between adjacent array units of the plurality of array units, the black matrix being opaque.

5. The array substrate according to claim 4, further comprising a first terminal lead and a second terminal lead, wherein the first connection electrode is electrically connected with the first terminal through the first terminal lead, and the second connection electrode is electrically connected with the second terminal through the second terminal lead, and wherein
   a gap is between the black matrix and the first terminal lead, and a gap is between the black matrix and the second terminal lead.

6. The array substrate according to claim 1, further comprising:
   a protrusion on a side of the first insulation layer away from the base substrate,
   wherein the light emitting device is further on the protrusion.

7. The array substrate according to claim 6, wherein the protrusion and the first insulation layer are integrally formed.

8. The array substrate according to claim 1, wherein the light emitting device is a small-sized light emitting diode or a micro-sized light emitting diode (Micro LED).

9. An electronic apparatus, comprising the array substrate according to claim 1.

10. The array substrate according to claim 1, wherein
    the first connection electrode comprises a first portion parallel to the base substrate and a second portion having an included angle with the base substrate; the first electrode comprises a first portion parallel to the base substrate and a second portion having an included angle with the base substrate;
    a first signal is transmitted to the light emitting device through the first electrode and the first connection electrode; and on a plane parallel to the base substrate, a width of the first portion of the first connection electrode in a direction perpendicular to a transmission direction of the first signal is larger than a width of the first portion of the first electrode in the direction perpendicular to the transmission direction of the first signal, so that the area of the orthogonal projection of the first connection electrode on the base substrate is larger than the area of the orthogonal projection of the first electrode on the base substrate.

11. The array substrate according to claim 10, wherein on a plane parallel to the base substrate, the width of the first portion of the first connection electrode in the direction perpendicular to the first signal transmission direction is larger than 10 μm.

12. The array substrate according to claim 1, further comprising:
    a second insulation layer between the thin film transistor and the first connection electrode to space the thin film transistor apart from the first connection electrode, wherein the second insulation layer comprises at least two via holes, and the first connection electrode is electrically connected with the first electrode of the thin film transistor through the at least two via holes.

13. The array substrate according to claim 10, further comprising:
a second insulation layer between the thin film transistor and the first connection electrode to space the thin film transistor apart from the first connection electrode,
wherein the second insulation layer comprises at least two via holes, and the first connection electrode is electrically connected with the first electrode of the thin film transistor through the at least two via holes.

14. A fabrication method of an array substrate, comprising:
providing a base substrate;
forming a thin film transistor on the base substrate, wherein the thin film transistor comprises a first electrode and a second electrode;
forming a first connection electrode on the base substrate, wherein the first connection electrode is in a layer different from the first electrode and is electrically connected with the first electrode; and
forming a first insulation layer covering at least a portion of the first connection electrode,
wherein an area of an orthographic projection of the first connection electrode on the base substrate is larger than an area of an orthographic projection of the first electrode on the base substrate, and the first insulation layer is made from an organic insulation material,
the fabrication method of the array substrate further comprises:
forming a light emitting device on the base substrate, wherein the light emitting device is provided on the base substrate, and the first electrode is electrically connected with the light emitting device through the first connection electrode; and
forming a second connection electrode, wherein the second connection electrode and the first connection electrode are formed by a same patterning process with a same mask, the first insulation layer further covers at least a portion of the second connection electrode, and an area of an orthographic projection of the second connection electrode on the base substrate is larger than the area of the orthographic projection of the first electrode on the base substrate;
the light emitting device comprises a first terminal, a light-emitting layer, and a second terminal; the first connection electrode is electrically connected with the first terminal; and the second connection electrode is electrically connected with the second terminal.

15. The fabrication method of the array substrate according to claim 14, further comprising:
forming a first insulation material layer by using an organic insulation material, wherein the first insulation material layer covers both the first connection electrode and the second connection electrode, the first insulation material layer is formed by a coating method; and
performing a patterning process on the first insulation material layer to form the first insulation layer.

16. The fabrication method of the array substrate according to claim 14, further comprising:
forming a protrusion on a side of the first insulation layer away from the base substrate,
wherein the forming the light emitting device on the base substrate comprises forming the light emitting device on the protrusion.

17. The fabrication method of the array substrate according to claim 16, wherein the first insulation layer and the protrusion are formed by a same patterning process with a same dual-tone mask.

18. The fabrication method of the array substrate according to claim 16, wherein the first insulation layer is formed by a single patterning process with a first mask, and the protrusion is formed by a single patterning process with the first mask.

* * * * *